United States Patent [19]

Kobayashi et al.

[11] Patent Number: 4,958,260
[45] Date of Patent: Sep. 18, 1990

[54] MOLDED CIRCUIT BOARD

[75] Inventors: Kenzo Kobayashi, Ichihara; Hirokazu Shiroishi, Hiratsuka, both of Japan

[73] Assignee: The Furukawa Electric Co., Ltd., Tokyo, Japan

[21] Appl. No.: 311,462

[22] Filed: Feb. 15, 1989

[51] Int. Cl.⁵ .............................................. H05K 1/00
[52] U.S. Cl. .................................................... 361/398
[58] Field of Search ................ 361/395, 398, 396, 412, 361/399, 415; 174/17 R, 18, 52.1

[56] References Cited

U.S. PATENT DOCUMENTS

| | | |
|---|---|---|
| 4,085,433 | 4/1978 | Baranowski . |
| 4,495,546 | 1/1985 | Nakamura et al. .................. 361/398 |
| 4,700,880 | 10/1987 | Glover .................................. 361/398 |
| 4,843,520 | 6/1989 | Nakatani et al. . |

FOREIGN PATENT DOCUMENTS

| | | |
|---|---|---|
| 1261205 | 2/1968 | Fed. Rep. of Germany . |
| 2836092 | 2/1980 | Fed. Rep. of Germany . |
| 2388460 | 11/1978 | France . |
| 62-248298 | 10/1987 | Japan . |

Primary Examiner—Roy N. Envall, Jr.
Attorney, Agent, or Firm—Frishauf, Holtz, Goodman & Woodward

[57] ABSTRACT

A molded circuit board is constructed by forming a plurality of resin moldings integrally with a circuit film including an insulating film and circuit pattern on the insulating film, spaced specified distances therebetween, on one side of the circuit film. The plurality of moldings can be assembled into an electronic device box by bending the intermediate portion, between the moldings, of the circuit film.

4 Claims, 3 Drawing Sheets

MOLDED CIRCUIT BOARD

BACKGROUND OF THE INVENTION

1. Field of the Invention

This invention relates to a molded circuit board made by integrally combining a circuit film with a resin moldings.

2. Description of the Related Art

FIG. 1 shows a well-known example of a molded circuit board made by integrally combining a circuit film with a resin molding (Japanese Patent Disclosure No. 62-248298). In FIG. 1, circuit board 11 is made by forming resin molding 12 in a developed form of a box and transferring circuit pattern 13 to the inside surface of the resin molding. The advantage of this circuit board 11 is that an electronic device hausing can be formed easily by mounting electronic parts 14 at the specified locations and bending circuit board 11 at grooves 15.

With conventional molded circuit boards as described above, the resin moldings need to be bent. Therefore, the materials for resin moldings are limited to those which can be bent, and it is difficult to secure dimensional stability for circuit boards and strength for electronic device boxes. The circuit pattern at the bent portion of a resin molding is subject to sharp bending. For this reason, the molded circuit board is susceptible to deterioration, leading to reliability problems.

SUMMARY OF THE INVENTION

The present invention has been made to eliminate the above difficulties and has as its object to provide a molded circuit board excellent in dimensional stability as a circuit board and high in strength and reliability when used in a box form.

A molded circuit board according to this invention comprises a circuit film having a desired circuit pattern formed thereon and a plurality of resin moldings formed on one side of said circuit film, spaced at specified distances from adjacent molding and integrated with said circuit film, said plurality of resin moldings being capable of being assembled into a box with the molding-free portion of said circuit film bent.

When a box is formed as described above, the resin moldings need not be bent. Therefore, it is possible to use formed resin with improved dimensional stability and greater strength. When a plurality of resin moldings are put together, the molding-free portion of the circuit film is bent smoothly and, because the circuit film is made of an insulating film as the base material and is very flexible, the wiring thereof is least liable to breakage.

DETAILED DESCRIPTION OF THE PREFERRED EMBODIMENT

An embodiment of the present invention will be described in detail with reference to the accompanying drawings.

Figure 1:
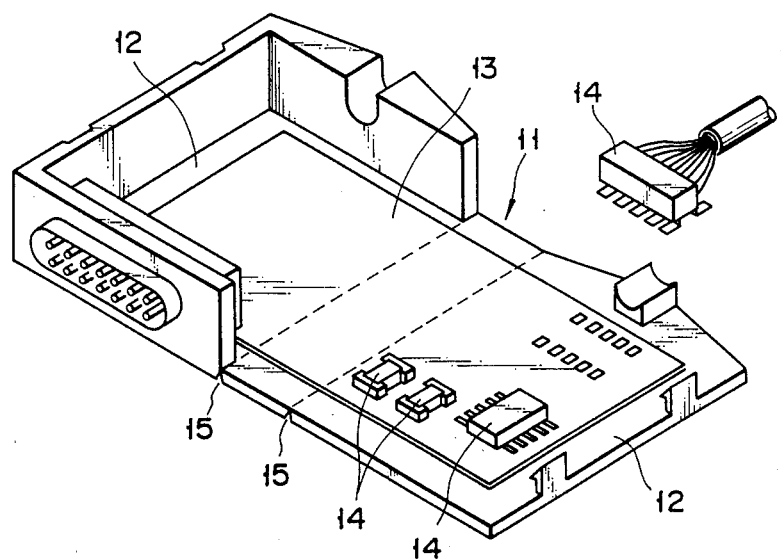
FIG. 1 is a perspective view showing a conventional molded circuit board.
Figure 2:
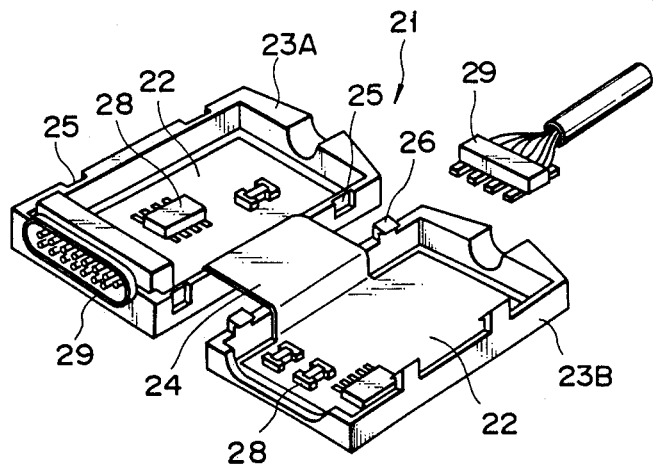
FIG. 2 is a perspective view showing a molded circuit board according to an embodiment of this invention.
Figure 3:
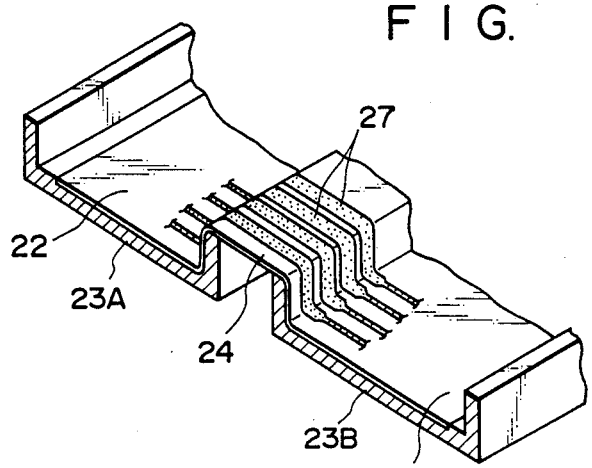
FIG. 3 is a perspective view showing a part of the circuit board of FIG. 2.

FIGS. 2 and 3 show a molded circuit board according to an embodiment of this invention. Molded circuit board 21 in those figures comprises a sheet of circuit film 22 and two resin moldings 23A and 23B. Circuit film 22 is a flexible, heat-resistant insulating film, one or two sides of which have a circuit pattern formed by pattern etching of copper foil or printing with a conductive paste. The two resin moldings 23A and 23B are formed on the side of circuit film 22 not having any parts mounted thereon, thereby constituting on integrated body in one molding operation. The resin moldings are connected by molding-free portion 24 of circuit film 22. Molding-free portion 24 is generally narrower than the remainder of circuit film 22.

Resin molding 23A is the lower-half of the case and resin molding 23B is the upper-half of the case. Catch 25 is formed for the former and hook 26 for the latter.

Figure 4:
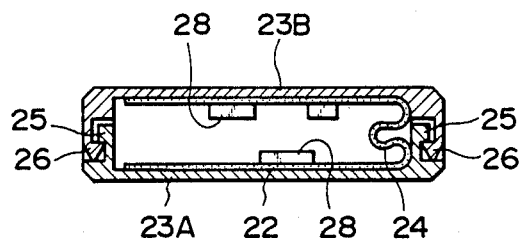
FIG. 4 is a cross-sectional view showing an assembled state of the circuit board of FIG. 2.

Therefore, a box as shown in FIG. 4 is constituted by combining those two resin moldings 23A and 23B. When resin moldings 23A and 23B are combined, a slack folding is formed, in the molding-free portion 24 of circuit film 22, whereby tension is prevented from being applied to that portion. The circuits in molding-free portion 24 have wider portion 27 than those in the other areas (the flat areas where parts are mounted) as shown in FIG. 3. The object is to improve the reliability of the circuit conductivity when the circuit film is bent.

To make molded circuit board 21 as described above, a mold capable of making two resin moldings 23A and 23B at the same time can be used. By setting circuit film 22 in the mold, insert molding can be performed whereby an integrally-molded circuit board is produced. After this, electronic parts 28 are mounted on circuit film 22, connectors 29 and others can be attached, and two resin moldings 23A and 23B are combined as shown in FIG. 4. In this manner, an electronic device can be assembled easily.

Figure 5:
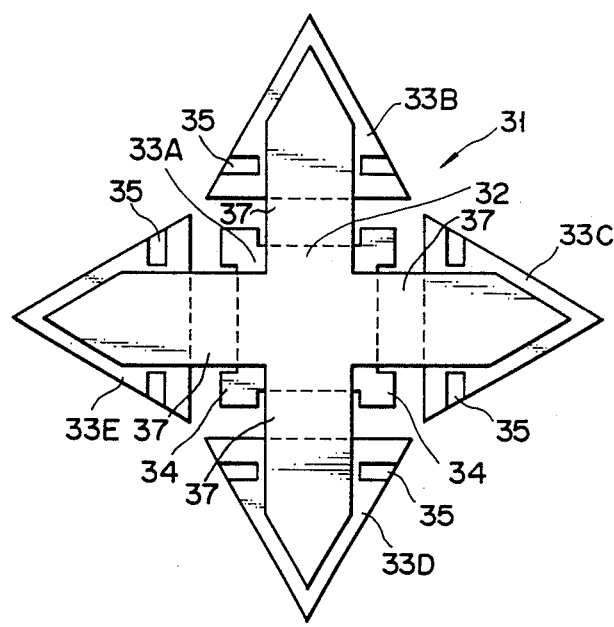
FIG. 5 is a plan view showing a molded circuit board according to another embodiment of this invention.
Figure 6:
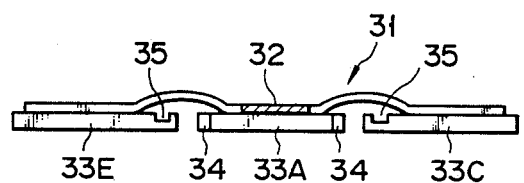
FIG. 6 is a cross-sectional view showing the circuit board of FIG. 5.

FIGS. 5 and 6 show a molded circuit board according to another embodiment of the present invention. Molded circuit board 31 in these figures comprises generally cross-shaped circuit film 32 and five resin moldings 33A through 33E formed by a molding operation on the reverse side of the circuit film. One central molding of the five resin moldings is a generally square with connecting projections 34 at the four corners and the other four moldings 33B through 33E are regular triangles each having two connecting recesses 35 at each side of the base, into which projection 34 mentioned above is inserted. Resin moldings 33A to 33E are connected by four molding-free portions 37.

Figure 7:
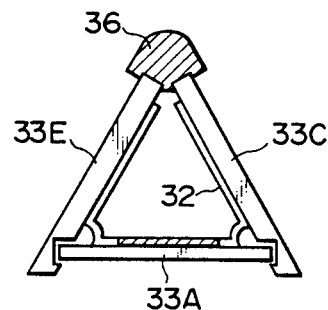
FIG. 7 is a cross-sectional view showing the assembled state of the circuit board of FIG. 5.

This molded circuit board 31 becomes a quadrangular-pyramid box when the five resin moldings 33A through 33E are assembled as shown in FIG. 7 with molding-free portions 37 bent. The numeral 36 indicates a cap.

As described above, according to this invention, a plurality of resin moldings are formed on one side of a circuit film and an assembled body is made by combining those resin moldings. Therefore, the resin moldings need not be bent. Hence, it is possible to use a resin with better dimensional stability and greater strength for the resin moldings and obtain molded circuit boards with higher accuracy and reliability. The plurality of resin moldings are connected via the molding-free portion or portions of the circuit film. The circuit film is made by forming a desired circuit pattern on an insulating film and is therefore flexible. The circuit film does not present any possibility of circuit discontinuity even when the molding-free connecting portions are bent. This also contributes to the improvement of reliability.

What is claimed is:

1. A molded circuit board comprising:
   a circuit film having a desired circuit pattern formed thereon; and
   a plurality of resin moldings formed on one side of said circuit film, said resin moldings being molded and spaced at specified distances from adjacent moldings so as to be integrated with and formed in one molding operation with said circuit film, said plurality of resin moldings thus forming at least one molding-free portion being capable of being assembled into a box with only said at least one molding-free portion of said circuit film being bent during assembly into a box.

2. A molded circuit board according to claim 1, wherein said at least one molding-free portion of said circuit film has a length so as to slacken when said resin moldings are assembled into a single body.

3. A molded circuit board according to claim 1, wherein said plurality of resin moldings are assembled into a polygon box, said moldings constituting faces of the polygon box, when said moldings are assembled.

4. A molded circuit board according to claim 1, wherein the circuit pattern formed on a molding-free portion of said circuit film is wider than that of the remainder of said circuit film.

* * * * *